(12) United States Patent
Kolman

(10) Patent No.: US 7,194,373 B2
(45) Date of Patent: Mar. 20, 2007

(54) DEVICE TESTING CONTROL

(75) Inventor: Robert S. Kolman, Longmont, CO (US)

(73) Assignee: Verigy Pte. Ltd,, Singapore (SG)

( * ) Notice: Subject to any disclaimer, the term of this patent is extended or adjusted under 35 U.S.C. 154(b) by 144 days.

(21) Appl. No.: 10/686,332

(22) Filed: Oct. 14, 2003

(65) Prior Publication Data
US 2005/0080583 A1    Apr. 14, 2005

(51) Int. Cl.
    G06F 19/00    (2006.01)
(52) U.S. Cl. .................................. 702/123; 702/122
(58) Field of Classification Search ................ 702/108, 702/117, 118, 119, 121, 122, 123; 714/718, 714/723, 732, 738, 742; 711/104
See application file for complete search history.

(56) References Cited

U.S. PATENT DOCUMENTS 6,574,626 B1 *  6/2003  Regelman et al. ............. 707/6
6,671,844 B1 * 12/2003  Krech et al. ................ 714/736
6,779,140 B2 *  8/2004  Krech et al. ................ 714/718

* cited by examiner

Primary Examiner—Bryan Bui

(57) ABSTRACT

Methods and systems for controlling device testing are disclosed. In one embodiment, the system comprises a local controller having a slave mode and a control mode, when in the control mode, the local controller to control testing of a device and to initiate one or more test instructions to be applied to the device, and when in the slave mode, to pass through a remote test instruction received from a remote controller to a tester. The system further comprises the tester, communicatively coupled to the local controller, to apply one of the one or more test instructions and the remote test instruction to the device.

16 Claims, 4 Drawing Sheets

DEVICE TESTING CONTROL

BACKGROUND OF THE INVENTION

Prior to shipping a device, such as a system-on-a-chip (SOC), the device must be tested to determine whether it has been manufactured correctly and is fully operational. A variety of testers are available for such testing. Typically, a tester is a very large and expensive machine which is designed to precisely position the placement of logic signal transitions at very high speeds. Most testers are aimed at creating a "functional environment" for a device which mimics the environment in which the device will eventually be used, to thereby demonstrate that the device will behave as expected in that environment.

For functional tests, a tester applies a series of "test vectors" to the inputs of the device. A test vector is a critically timed cycle of events lasting a short period of time referred to as a "vector cycle". Within a vector cycle, and at precisely calculated times, logic signal drivers in the tester apply stimulus to device inputs. At the same or some precisely delayed time, logic signal comparators in the tester monitor responses at device outputs. When many test vectors are executed sequentially, discrepancies between monitored and expected device outputs, if any, are noted as device failures.

An alternative or adjunct to functional testing is "structural" testing (e.g., "scan" testing). Structural testing enables the testing of structures which are deeply embedded within a device. Rather than testing the device's internal structure by applying stimulus to the device's inputs, structural testing involves shifting a series of test vectors into the core of a device, and after each test vector is shifted in, launching the test vector and capturing a response. Each response is then shifted out of the device. In this manner, a tester can verify that all of a device's elements are present and operational. An assumption of structural testing is that if all elements are present and operational, then the elements will contribute to performing the greater and intended functions of the device (e.g., adding, shifting, etc.), and the device will function as designed.

During testing, hundreds of devices having the same design may need to be tested. Additionally, each device under test may be subjected to multiple tests of varying types. In some cases, the selection of tests to be executed may vary depending upon the results of previous tests.

SUMMARY OF THE INVENTION

Methods and systems for controlling device testing are disclosed. In one embodiment, the system comprises a local controller having a slave mode and a control mode. When in the control mode, the local controller is to control testing of a device and to initiate one or more test instructions to be applied to the device. When in the slave mode, the local controller passes through a remote test instruction received from a remote controller to a tester. The system further comprises the tester, communicatively coupled to the local controller, to apply one of the one or more test instructions and the remote test instruction to the device.

BRIEF DESCRIPTION OF THE DRAWINGS

Illustrative embodiments of the invention are illustrated in the drawings in which.

DETAILED DESCRIPTION

Figure 1:
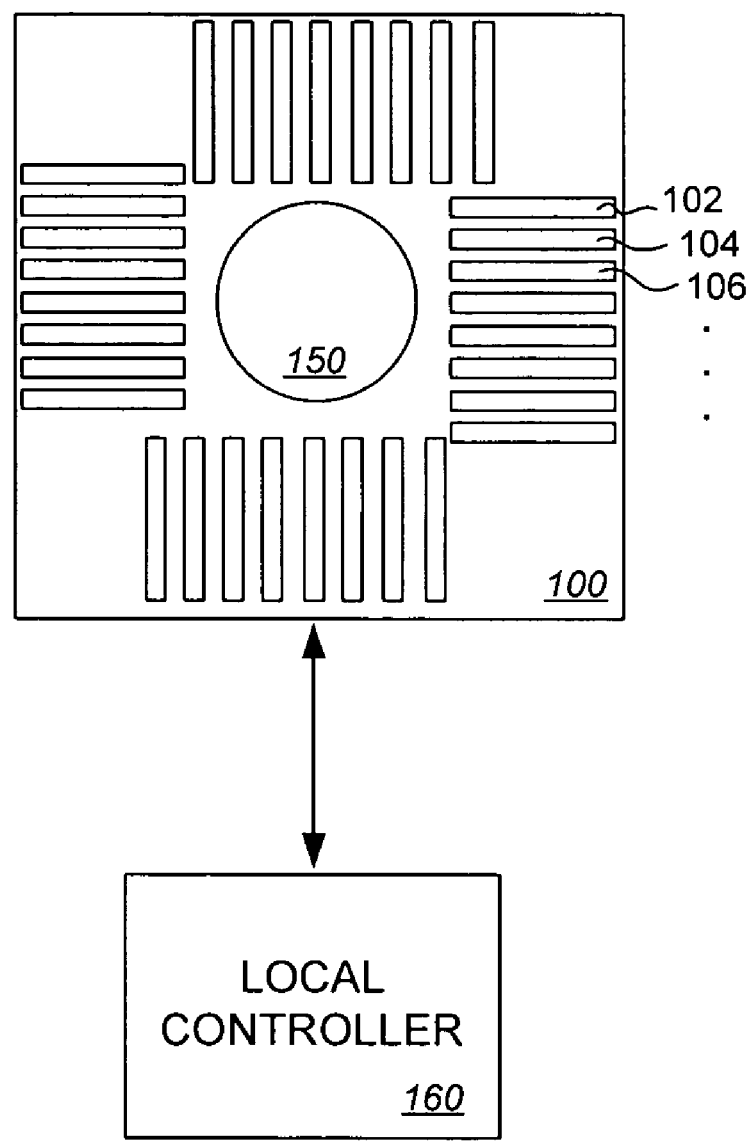
FIG. 1 illustrates a first exemplary configuration of a system, which may be used to test one or more devices.

An exemplary embodiment of a system that may be used to test one or more devices is illustrated in FIG. 1. The system includes a local controller 160 having at least two modes of operation: a control mode, and a slave mode. When in the control mode, local controller 160 controls testing of device 150. The control of testing may include initiation of one or more test instructions to be applied to device 150. By way of example, the test instructions initiated by local controller 160 may be selected from tests in a test file or another location. Depending upon factors, such as the results of one or more previous executions of test instructions and instructions found in a test file, local controller 160 may control branching, iteration, and looping of the tests in the test file and initiate test instructions to tester 100 accordingly.

Local controller 160 may also control the application of test instructions to multiple devices while in the control mode. For example, local controller 160 may communicate with a prober/handler (not shown) to direct the removal of device 150 after testing is complete and the insertion of another device to be tested. The second device may have the same configuration as device 150. Thus, local controller 160 may manage testing of multiple lots, cassettes, or other groupings of devices. Alternately, the second device may have a different configuration with different tests that need to be applied.

In the control mode, local controller 160 may also manage test results received from the tester 100 as a result of applying the one or more test instructions to device 150. As previously described, test results may be used by local controller 160 to determine which test instruction should be sent to tester 100. Additionally, in some embodiments, management of the test results may include compiling a plurality of test results from multiple test instructions applied to device 150. If multiple devices of the same configuration were tested, local controller may also compile the results for the lots, cassettes, or other grouping of devices. In some embodiments, the individual or compiled results may be used by local controller, or other component, to determine if a device, lot, cassette, or other grouping passed device testing.

Figure 2:
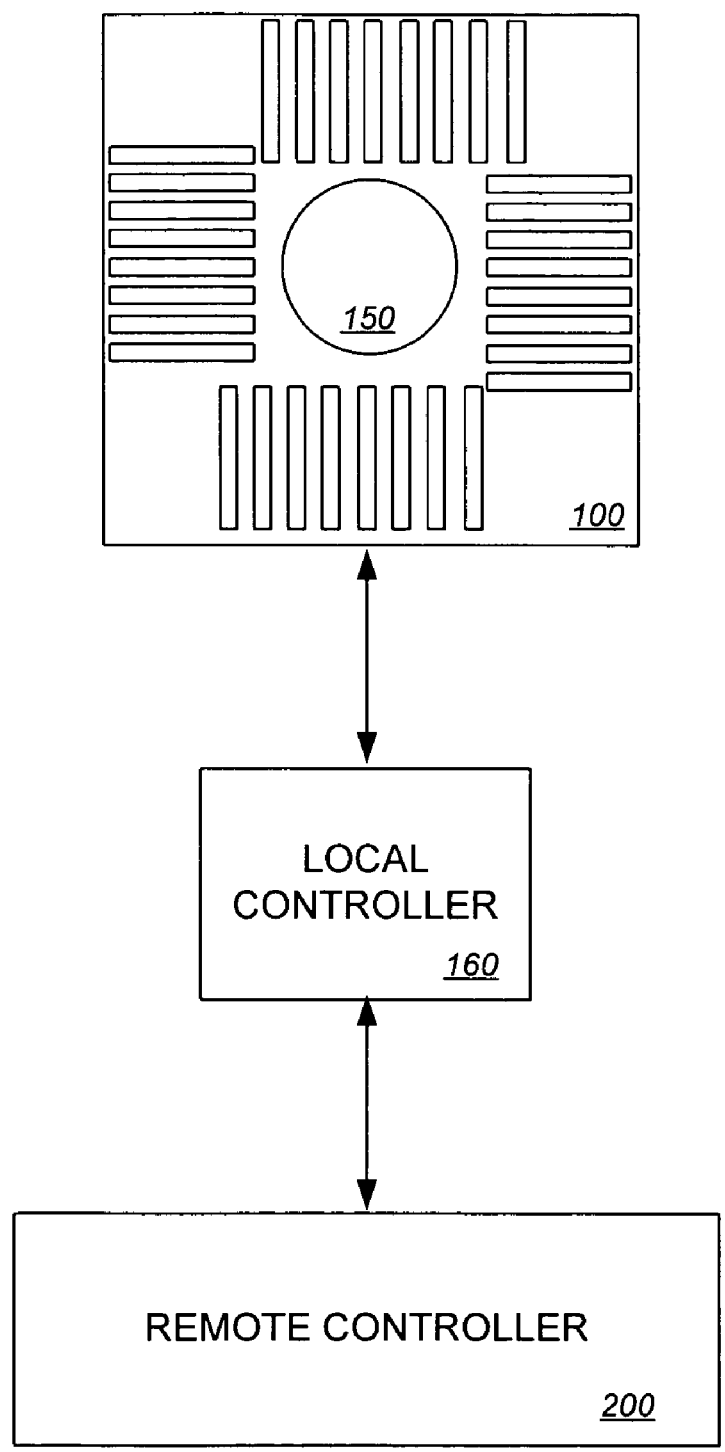
FIG. 2 illustrates a second exemplary configuration of a system, which may be used to test one or more devices.

As shown in FIG. 2, in a second exemplary configuration, local controller 160 may be communicatively coupled to a remote controller 200. By way of example, remote controller 200 may be a station controller as defined by the SEMI (Semiconductor Equipment and Materials International) Station Controller Architecture. In this configuration, remote controller 200 controls the testing of device 150 and local controller operates in slave mode. In the slave mode, local controller 160 may pass through test instructions received from the remote controller 200 to the tester 100. Local controller 160, in the slave mode, may also pass through results of test instructions to the remote controller 200. The results passed through to the remote controller 200 may also be compiled by local controller 160 for local reference.

In some embodiments, local controller 160 may be communicatively coupled to memory (not shown) to receive test instructions from the remote controller 200. Local controller 160 may poll the memory to detect the presence of a test instruction initiated by remote controller 200. If local controller 160 is in control mode and an instruction from the remote controller 200 is detected, local controller 160 may switch from the control mode to the slave mode. In alternate embodiments, a flag or semaphore may be used to switch local controller 160 between its two modes. Alternately, a parameter may be configured to direct local controller 160 to operate in either the slave mode or control mode. It should be appreciated that alternate methods may also be used to switch modes. It should also be appreciated that local controller 160 may be software, firmware, hardware, or a combination of these and in some embodiments may be a part of tester 100.

In the configurations of both FIGS. 1 and 2, local controller 160 is communicatively coupled to tester 100. By way of example, tester 100 may be a system-on-a-chip (SOC) tester. Tester 100 may include a plurality of boards 102–106. Each board may include a plurality of pins (not shown) to apply logic signals to a device 150 under test according to test instructions received from local controller 160. The pins may also be used to receive outputs from device 150. In one embodiment, each pin may include its own memory to use during the testing of the device. The memory may be used to store pin specific vector information. In alternate embodiments, memory may not be included on each pin, but may instead be included for each board or other component of tester 100. In alternate embodiments other types and configurations of testers may also be used to apply test instructions to device 150.

In one embodiment, the device 150 under test may be a system-on-a-chip (SOC). In alternate embodiments, device 150 may be a wafer having multiple devices to be tested or other type of circuit device. Additionally, at times between testing of devices, tester 100 will not be coupled to a device 150.

It should be appreciated that tester 100 and local controller 160 may be used in configurations in which local control of testing is needed and configurations in which a remote controller 200 is used to control testing. This may allow a supplier to sell the same tester 100 and local controller 160 in a variety of customer configurations. Additionally, customers may change between local and remote controlled configurations without needing to change tester 100 or local controller 160.

Figure 3:
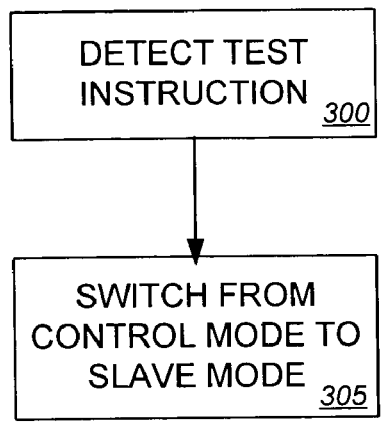
FIG. 3 illustrates an exemplary method that may be used by the local controller of FIG. 1 or 2 to switch between modes of test control.

FIG. 3 illustrates an exemplary method that may be used by local controller 160 to switch between modes of test control. First, a test instruction received from a remote controller 200 is detected 300. By way of example, the test instruction may be detected 300 by polling a memory or checking a semaphore. After the test instruction is detected 300, local controller 160 switches 305 from control mode to slave mode.

After local controller 160 switches 305 to slave mode, the test instruction may be passed through to tester 100 and the tester 100 may then apply the test instruction to a device 150. Local controller 160 may then pass through the test result to remote controller 200. In some embodiments, local controller 160 may compile the result with one or more additional results that were previously passed through to the remote controller 200 so that this information may be locally available.

It should be appreciated that in alternate embodiments, other methods may be used to switch local controller between modes of test control. By way of example, a configurable parameter may be provided to direct local controller 160 to operate in slave mode or control mode. Alternately, local controller 160 may initially operate in slave mode until an event happens to trigger local controller 160 to switch to control mode.

Figure 4:
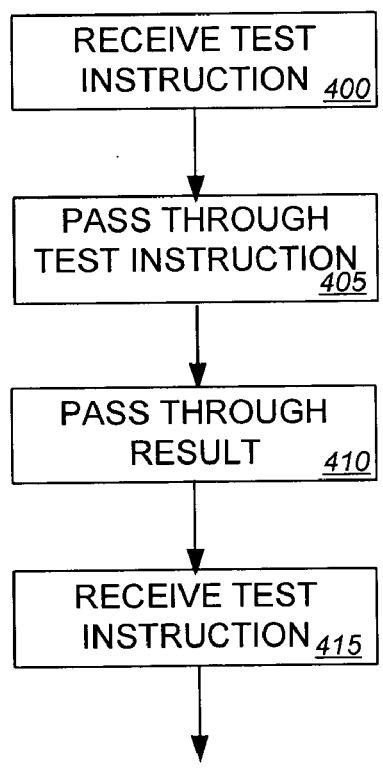
FIG. 4 illustrates an exemplary method that may be used by the configuration of FIG. 2 during device testing.
Figure 5:
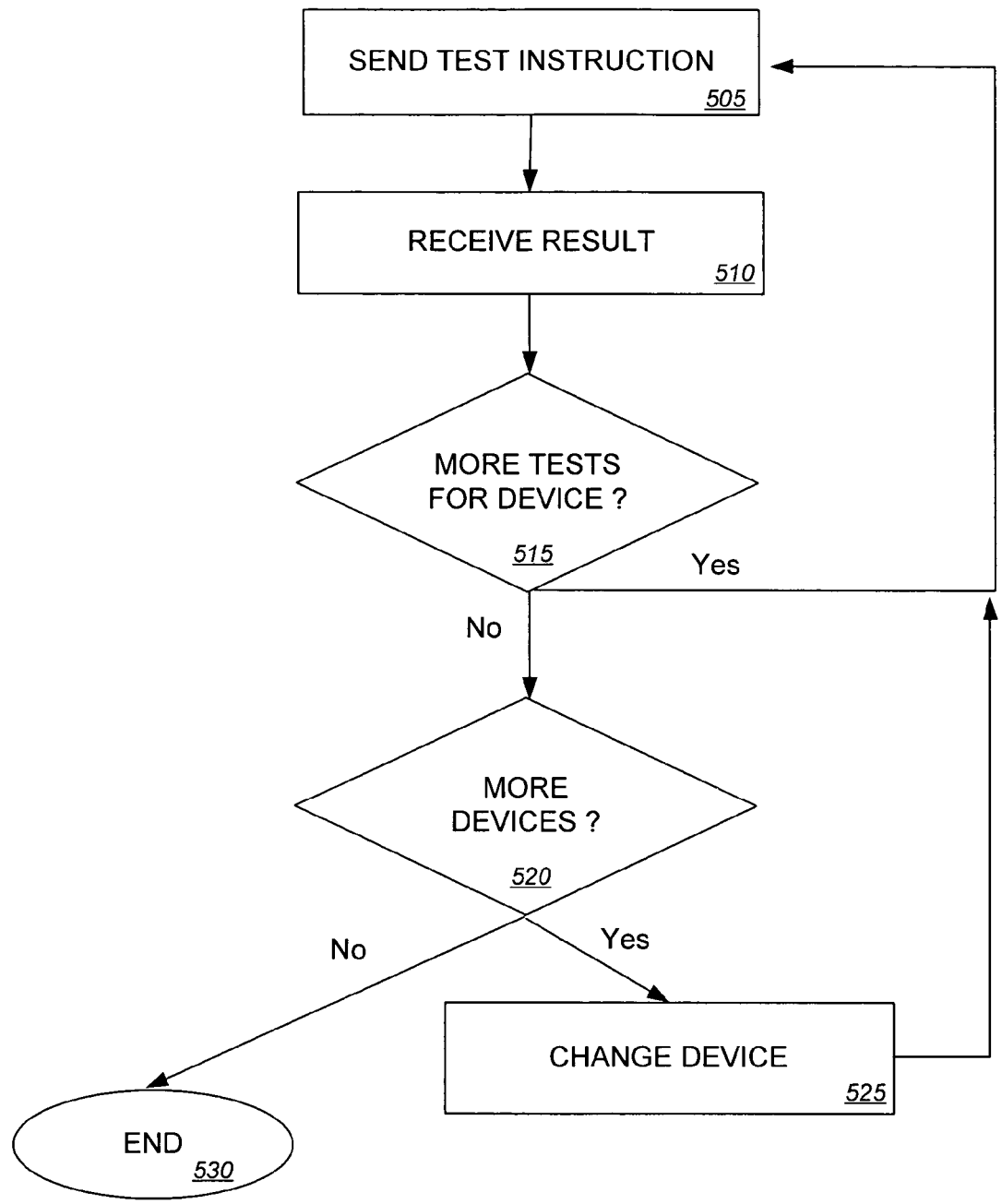
FIG. 5 illustrates an exemplary method that may be used by the configuration of FIG. 1 during device testing.

A simplified explanation of the differences between testing control when local controller 160 is in slave mode and when local controller 160 is in control mode can be given with reference to FIGS. 4 and 5. FIG. 4 illustrates an exemplary flow of testing that may be used while local controller 160 is in slave mode. In the slave mode, a test instruction from remote controller is received 400 by local controller 160. The test instruction is then passed through 405 to tester 100.

After the test instruction has been applied to device 150 by tester 100, a result of the test instruction is passed through 410 to remote controller 200. This process may be repeated for additional test instructions. Thus, in slave mode, the testing of device 150, including the selection of test instructions to be applied, is done by remote controller 200.

In contrast, as illustrated in FIG. 5, while in control mode, local controller 160 controls the testing of device 150. Local controller 160 sends 505 a test instruction to tester 100. As previously described, local controller 160 may obtain the test instructions to be sent to tester 100 from tests in a test file or another location.

After the tester 100 has applied the test instruction to device 150, local controller 160 receives 510 the test result. Local controller 160 then determines 515 if there are more tests that need to be applied to the device 150 currently being tested. If there are more tests, local controller 160 sends 505 the next instruction to tester 100. During testing, local controller 160 may branch, iterate, and loop through tests found in a test file and may examine test results to determine which test instruction should be sent to tester 100.

If 515 there are no more tests for device 150, local controller 160 may determine 520 if there are more devices with the same configuration as device 150 that need to be tested. If not, testing ends 530. If there are more devices, local controller 160 may direct a prober/handler (or other mechanism) to change the device 525 to the next device that needs to be tested. A test instruction to be applied to the new device is then sent 505 to the tester 100. Thus, control of the device testing is done by local controller 160 when local controller 160 is in control mode.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A system comprising:

a local controller having a slave mode and a control mode, when in the control mode, the local controller to control testing of a device and to initiate one or more test instructions to be applied to the device, and when in the slave mode, to pass through a remote test instruction received from a remote controller to a tester;

memory, communicatively coupled to the local controller, to receive the remote test instruction from the remote controller, the local controller obtaining the remote test instruction from the memory; and the tester, communicatively coupled to the local controller, to apply one of the one or more test instructions and the remote test instruction to the device;

wherein the local controller polls the memory to detect the presence of the remote test instruction and switches from the control mode to the slave mode upon detecting the remote test instruction.

2. The system of claim 1, further comprising the remote controller, communicatively coupled to the local controller, to control testing of the plurality of devices when the local controller is in the slave mode.

3. The system of claim 1, wherein the local controller, when in the slave mode, is further to pass through a result of the remote test instruction to the remote controller.

4. A system comprising:
a local controller having,
a slave mode wherein the local controller i) controls testing of a device by initiating one or more test instructions to be applied to the device, and ii) manages at least one test result received from the tester as a result of applying the one or more test instructions; and
a slave mode wherein the local controller passes through a remote test instruction received from a remote controller to a tester; and
the tester, communicatively coupled to the local controller, to apply one of the one or more test instructions and the remote test instruction to the device.

5. The system of claim 1, wherein the local controller is further to control testing of a second device and to initiate one or more test instructions for the second device when in the control mode and wherein the tester is further to apply the one or more test instructions for the second device to the second device.

6. The system of claim 1, wherein the tester comprises a system-on-a-chip (SOC) tester.

7. A method, implemented by a local controller of a test system, comprising:
detecting a remote test instruction received from a remote controller; and
upon detecting the remote test instruction, switching from a control mode, to control testing of a device and to initiate one or more test instructions to be applied to the device, to a slave mode to pass through the remote test instruction to a tester.

8. The method of claim 7, further comprising passing through the remote test instruction to the tester.

9. The method of claim 7, further comprising applying the remote test instruction to a device.

10. The method of claim 9, wherein applying the remote test instruction comprises applying the test instruction to a system-on-a-chip (SOC).

11. The method of claim 7, further comprising passing through a result of the remote test instruction to the remote controller.

12. The method of claim 11, further comprising locally compiling the result with a plurality of additional results passed through to the remote controller.

13. The method of claim 7, wherein detecting a remote test instruction comprises polling a memory shared with the remote controller.

14. A method, implemented by a local controller of a test system, comprising:
detecting a remote test instruction received from a remote controller by checking a semaphore; and
upon detecting the remote test instruction, switching from a control mode, to control testing of a device and to initiate one or more test instructions to be applied to the device, to a slave mode to pass through the remote test instruction to a tester.

15. The method of claim 7, wherein detecting a remote test instruction comprises detecting a test instruction to be applied to a system-on-a-chip (SOC).

16. A system, comprising:
a local controller having a slave mode and a control mode, when in the control mode, the local controller to control testing of a device and to initiate one or more test instructions to be applied to the device, and when in the slave mode, to pass through a remote test instruction received from a remote controller to a tester;
memory, communicatively coupled to the local controller, to receive the remote test instruction from the remote controller, the local controller obtaining the remote test instruction from the memory; and
the tester, communicatively coupled to the local controller, to apply one of the one or more test instructions and the remote test instruction to the device;
wherein the local controller detects the presence of the remote test instruction by checking a semaphore, and upon detecting the remote test instruction, switches from the control mode to the slave mode.

* * * * *